(12) United States Patent
Kang et al.

(10) Patent No.: US 11,567,132 B2
(45) Date of Patent: Jan. 31, 2023

(54) SCAN APPARATUS CAPABLE OF FAULT DIAGNOSIS AND SCAN CHAIN FAULT DIAGNOSIS METHOD

(71) Applicant: UIF (University Industry Foundation), Yonsei University, Seoul (KR)

(72) Inventors: Sungho Kang, Seoul (KR); Seokjun Jang, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 0 days.

(21) Appl. No.: 17/673,075

(22) Filed: Feb. 16, 2022

(65) Prior Publication Data

US 2022/0381825 A1 Dec. 1, 2022

(30) Foreign Application Priority Data

Feb. 17, 2021 (KR) .................. 10-2021-0021468
Feb. 11, 2022 (KR) .................. 10-2022-0018267

(51) Int. Cl.
*G01R 31/3185* (2006.01)
*G01R 31/327* (2006.01)
*G01R 31/28* (2006.01)
*G01R 31/317* (2006.01)

(52) U.S. Cl.
CPC . *G01R 31/318536* (2013.01); *G01R 31/2836* (2013.01); *G01R 31/31705* (2013.01); *G01R 31/318533* (2013.01); *G01R 31/318538* (2013.01); *G01R 31/318541* (2013.01); *G01R 31/318544* (2013.01); *G01R 31/318591* (2013.01); *G01R 31/3275* (2013.01)

(58) Field of Classification Search
CPC .... G01R 31/318536; G01R 31/318591; G01R 31/318538; G01R 31/318541; G01R 31/318544; G01R 31/3275; G01R 31/2836; G01R 31/31705; G01R 31/318533
USPC ........................................ 714/729, 726, 72
See application file for complete search history.

(56) References Cited

U.S. PATENT DOCUMENTS 6,615,380 B1 * 9/2003 Kapur ............ G01R 31/318544
714/739
2004/0181722 A1 * 9/2004 Lee ................ G01R 31/318569
714/726
(Continued)

OTHER PUBLICATIONS

Jang et al., Reconfigurable Scan Architecture for High Diagnostic Resolution, Aug. 27, 2021, IEEE, pp. 120537-120550. (Year: 2021).*
(Continued)

*Primary Examiner* — John J Tabone, Jr.
(74) *Attorney, Agent, or Firm* — Paratus Law Group, PLLC

(57) ABSTRACT

Provided are scan device and method of diagnosing scan chain fault. The scan device for diagnosing a fault includes a scan partition including a plurality of scan chains which include path control scan flipflops connected to scan flipflops in cascade. In the scan partition, connection paths of the scan flipflops are controllable. The connection paths of the path control scan flipflops are controlled to detect a position of a fault such that a fault range in the scan partition is reduced to diagnose the fault.

16 Claims, 16 Drawing Sheets

(56) References Cited

U.S. PATENT DOCUMENTS

| | | | | |
|---|---|---|---|---|
| 2007/0226565 A1* | 9/2007 | Kudo | ............ | G01R 31/318552 |
| | | | | 714/731 |
| 2010/0205492 A1* | 8/2010 | Sinanoglu | ...... | G01R 31/318335 |
| | | | | 714/E11.155 |
| 2010/0318864 A1* | 12/2010 | Funatsu | ......... | G01R 31/318566 |
| | | | | 714/E11.155 |
| 2011/0099442 A1* | 4/2011 | Hales | ............ | G01R 31/318533 |
| | | | | 714/E11.155 |

OTHER PUBLICATIONS

Wu, Diagnosis of Scan Chain Failures, Jan. 1, 1998, IEEE. pp. 1-6. (Year: 1998).*

Seokjun Jang et al., "Reconfigurable Scan Architecture for High Diagnostic Resolution", IEEE Access, Aug. 27, 2021, pp. 120537-120550, vol. 9.

\* cited by examiner

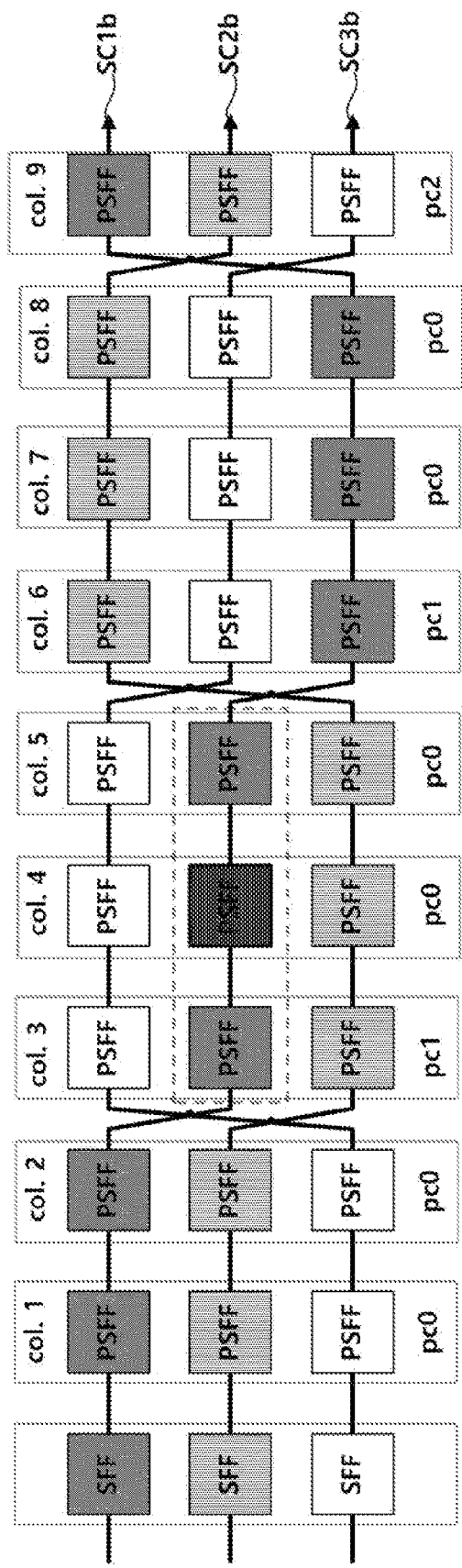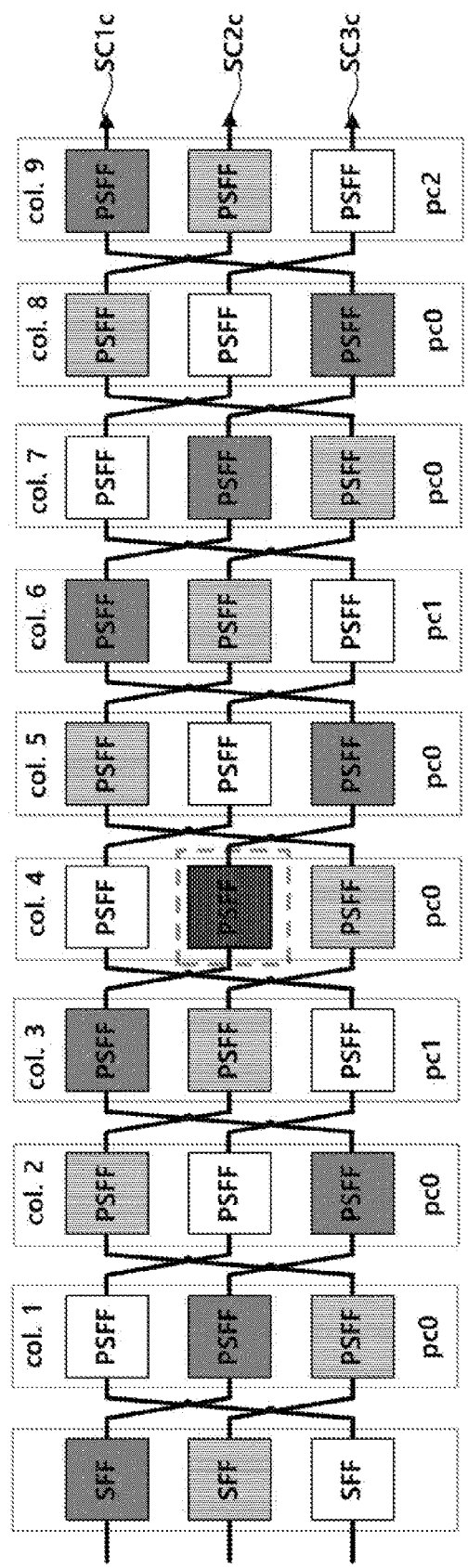

SCAN APPARATUS CAPABLE OF FAULT DIAGNOSIS AND SCAN CHAIN FAULT DIAGNOSIS METHOD

CROSS-REFERENCE TO RELATED APPLICATION

This application claims priority to Korean Patent Application Nos. 10-2021-0021468 (filed on Feb. 17, 2021) and 10-2022-0018268 (filed on Feb. 11, 2022), which are all hereby incorporated by reference in their entirety.

BACKGROUND

The present invention relates to a scan device capable of fault diagnosis and a method of diagnosing a scan chain fault.

According to existing hardware-based scan chain fault diagnosis methods, a diagnostic resolution for fault diagnosis may be maximized using additional hardware. However, most of the methods focus on single fault diagnosis in a scan chain. According to a method of diagnosing multiple faults, it is possible to make multiple diagnoses, but many test pins are additionally required for structural application. Also, with an increase in the number of faults in circuitry, the diagnostic resolution drastically degrades.

In an initial processing stage before processing stabilization, a large number of faults occur in practice. Without a method of accurately making diagnoses on such a large number of faults at a high resolution, time and costs required for physical analysis on fault candidate positions which are diagnosed later remarkably increase.

One of the problems to be solved by this embodiment is to providing a scan device and method for diagnosing a single scan chain fault and a plurality of scan chain faults at a high resolution.

SUMMARY

Scan device according to the present embodiment comprises: a scan partition including a plurality of scan chains which include path control scan flipflops connected to scan flipflops in cascade, in the scan partition, connection paths of the scan flipflops are controllable, and the connection paths of the path control scan flipflops are controlled to detect a position of a fault such that a fault range in the scan partition is reduced to diagnose the fault.

According to an aspect of present embodiment, the path control scan flipflops may be disposed in an array in the scan partition, and the connection paths of the path control scan flipflops disposed in the same column in the array may be controlled with the same path control signal.

According to an aspect of present embodiment, each of the path control scan flipflops may include: a first input to which an output of a previous stage is provided in the scan chain in which the path control scan flipflop is disposed; a second input to which an output of the same column as the path control scan flipflop in another scan chain included in the scan partition is provided; a multiplexer (MUX) configured to output any one of signals provided to the first input and the second input according to a path control signal; and a flipflop.

According to an aspect of present embodiment, the scan device diagnosing the fault may perform a first phase of controlling the connection paths of the path control scan flipflops to reduce the fault range in the scan partition and detect the position of the fault and further perform a second phase when three or more faults are detected in the scan partition as a result of the first phase.

According to an aspect of present embodiment, each of the scan chains may include L of the scan flipflops, the scan partition may include the N scan chains, and the first phase may include: (a) performing a flush test without changing the paths; (b) providing a path control signal to an $(N^i)^{th}$ column, where $N^i$ is smaller than but closest to L, to change the paths and performing a flush test; and (c) sequentially providing the path control signal to (multiples of $N^{i-1})^{th}$ columns and (multiples of $N^{i-2})^{th}$ columns to a first column, of which the paths have not been changed, to change the paths and performing a flush test (N, L, and i: integers greater than or equal to 0).

According to an aspect of present embodiment, the paths formed in the second phase may be paths which are not connected in operations (a) to (c).

According to an aspect of present embodiment, when no fault is detected or two or fewer faults are detected in the scan partition as a result of the first phase, the scan device may stop detecting the position of the fault.

According to an aspect of present embodiment, the position of the fault may be detected through the flush test, which provides a flush pattern including logic highs and logic lows at a predetermined ratio, and when an input signal including the logic highs and the logic lows at the predetermined ratio is output with a changed phase, the path control scan flipflop may be determined to be faulty.

A method of diagnosing a scan chain fault according to the present embodiment comprises: a first phase of changing connection paths of path control scan flipflops to reduce a fault range in a scan partition, which includes a plurality of scan chains including the path control scan flipflops connected to simple scan flipflops in cascade, and detect a fault; and a second phase in which the path control scan flipflops are connected to connection paths, which have not been changed in the first phase, according to a result of the first phase to detect a position of the fault in the scan partition.

According to an aspect of present embodiment, the path control scan flipflops may be disposed in an array in the scan partition, and the connection paths of the path control scan flipflops disposed in the same column in the array may be controlled with the same path control signal.

According to an aspect of present embodiment, each of the path control scan flipflops may include: a first input to which an output of a previous stage is provided in the scan chain in which the path control scan flipflop is disposed; a second input to which an output of the same column as the path control scan flipflop in another scan chain included in the scan partition is provided; a MUX configured to output any one of signals provided to the first input and the second input according to a path control signal; and a flipflop.

According to an aspect of present embodiment, the second phase may be performed when three or more faults are detected in the scan partition as a result of the first phase.

According to an aspect of present embodiment, each of the scan chains may include L of the scan flipflops, the scan partition may include the N scan chains, and the first phase may include: (a) performing a flush test without changing the paths; (b) providing a path control signal to an $(N^i)^{th}$ column, where $N^i$ is smaller than but closest to L, to change the paths and performing a flush test; and (c) sequentially providing the path control signal to (multiples of $N^{i-1})^{th}$ columns and (multiples of $N^{i-2})^{th}$ columns to a first column, of which the paths have not been changed, to change the paths and performing a flush test (N, L, and i: integers greater than or equal to 0).

According to an aspect of present embodiment, the second phase may include providing the path control signal to the $(N^i)^{th}$ column and $N^{i-1}$th column to the first column in order of not receiving the path control signal in operations (a) to (c) to detect the fault.

According to an aspect of present embodiment, when no fault is detected or two or fewer faults are detected in the scan partition as a result of the first phase, the detection of the position of the fault may be stopped.

According to an aspect of present embodiment, the position of the fault may be detected through the flush test, which provides a flush pattern including logic highs and logic lows at a predetermined ratio, and when an input signal having the logic highs and the logic lows at the predetermined ratio is output with a different phase than the input flush pattern, the path control scan flipflop may be determined to be faulty.

According to the present embodiment, an advantageous effect that single defects and multiple defects located in the scan partition can be detected with high resolution is provided.

BRIEF DESCRIPTION OF THE DRAWINGS

FIGS. 4 to 7 are diagrams illustrating first to fourth operations of a first phase.

DETAILED DESCRIPTION

Hereinafter, the present embodiment will be described with reference to the accompanying drawings.

Figure 1:
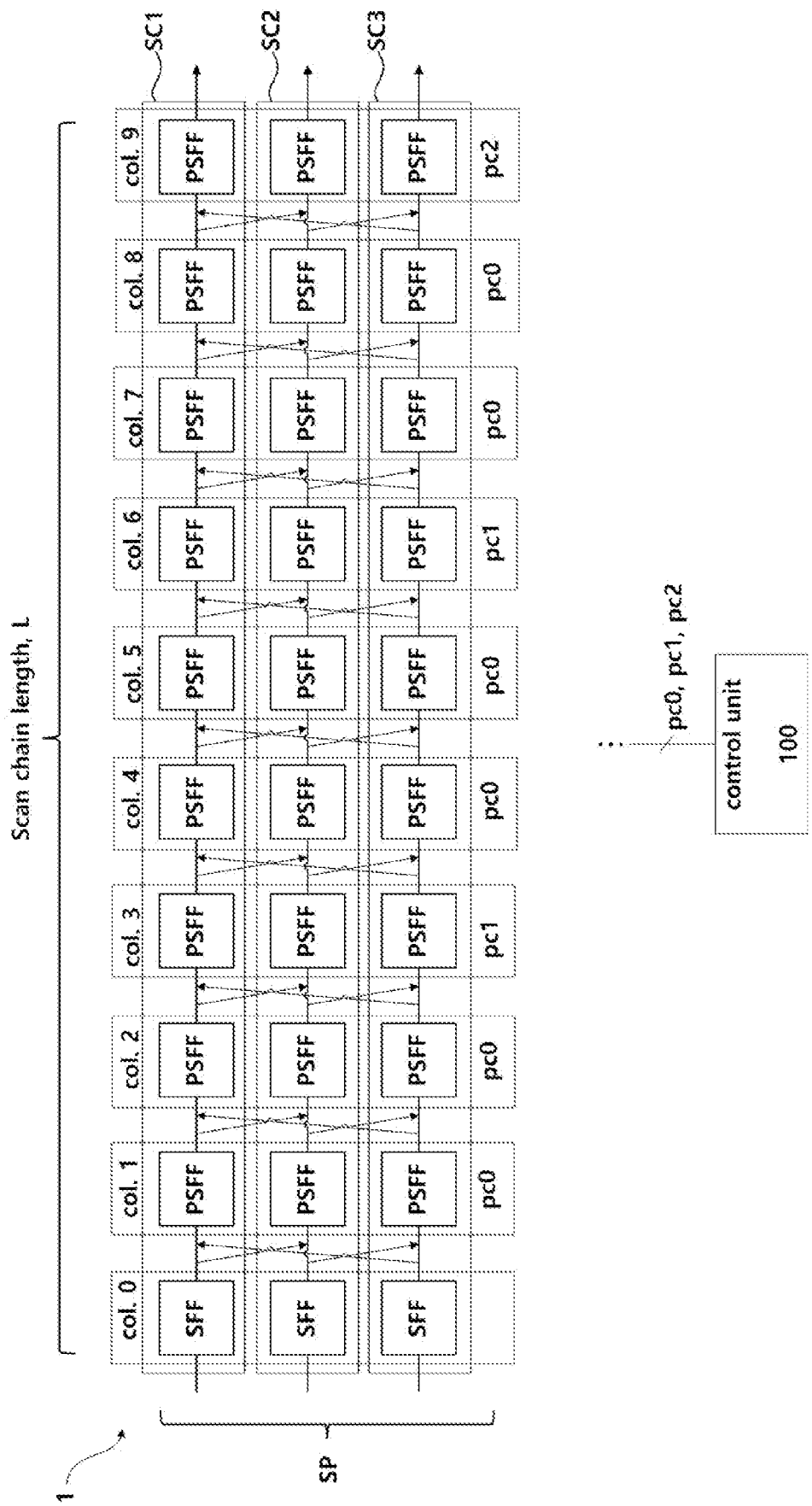
FIG. 1 is a diagram showing an overview of a scan device according to the present exemplary embodiment.

FIG. 1 is a diagram showing an overview of a scan device 1 according to the present exemplary embodiment. The scan device 1 includes a scan partition SP including a plurality of scan chains SC1, SC2, and SC3, which include path control scan flipflops PSFF connected to scan flipflops SFF in cascade, and a control unit 100 for controlling connection paths of scan flipflops in the scan partition SP. The control unit 100 controls connection paths of the path control scan flipflops PSFF to reduce a fault range in the scan partition SP and detect the position of a fault, thereby diagnosing the fault.

In the shown embodiment, the simple scan flipflops SFF and the path control scan flipflops PSFF constituting the scan partition SP may be disposed in an array, and the same path control signal pc is provided to flipflops included in the same column.

According to an exemplary embodiment, when the number of scan chains SC included in the scan partition SP is N and the length of the scan chains SC is L, a maximum integer i which is smaller than or equal to L is calculated as $N^i$. A path control signal provided to an $(N^i)^{th}$ column is referred to as pci, and a path control signal provided to (multiples of $N^{i-1})^{th}$ columns is referred to as pci-1. A path control signal provided to (multiples of $1)^{th}$ columns among columns to which no path control signal is allocated is referred to as pc0.

In the exemplary embodiment shown in FIG. 1, the number of scan chains SC included in the scan partition is 3, and the length of the scan chains SC is 10. Since $3^2=9$, the maximum integer i is 2. Accordingly, a path control signal provided to a $3^2$ column is referred to as pc2, and a path control signal provided to $3^{rd}$ and $6^{th}$, which are multiples of $3^1$, columns is referred to as pc1. Also, when a path control signal provided to (multiples of $1)^{th}$ columns among columns to which no path control signal is allocated is referred to as pc0, the path control signals are as shown in FIG. 1.

However, the exemplary embodiment illustrated in FIG. 1 is for convenience of description and is not intended to limit the scope of the present invention. It is self-evident that the number of scan chains SC included in the scan partition SP, the length of the scan chains SC, and the number of scan partitions included in the scan device may vary.

The control unit 100 may provide the path control signals pc2, pc1, and pc0. For example, the control unit 100 may be automatic test equipment (ATE) connected to a device under test (DUT) including the scan device 1, and the scan device 1 may electrically communicate with the control unit 100 through an external connection terminal (not shown) formed on the DUT.

Figure 2:
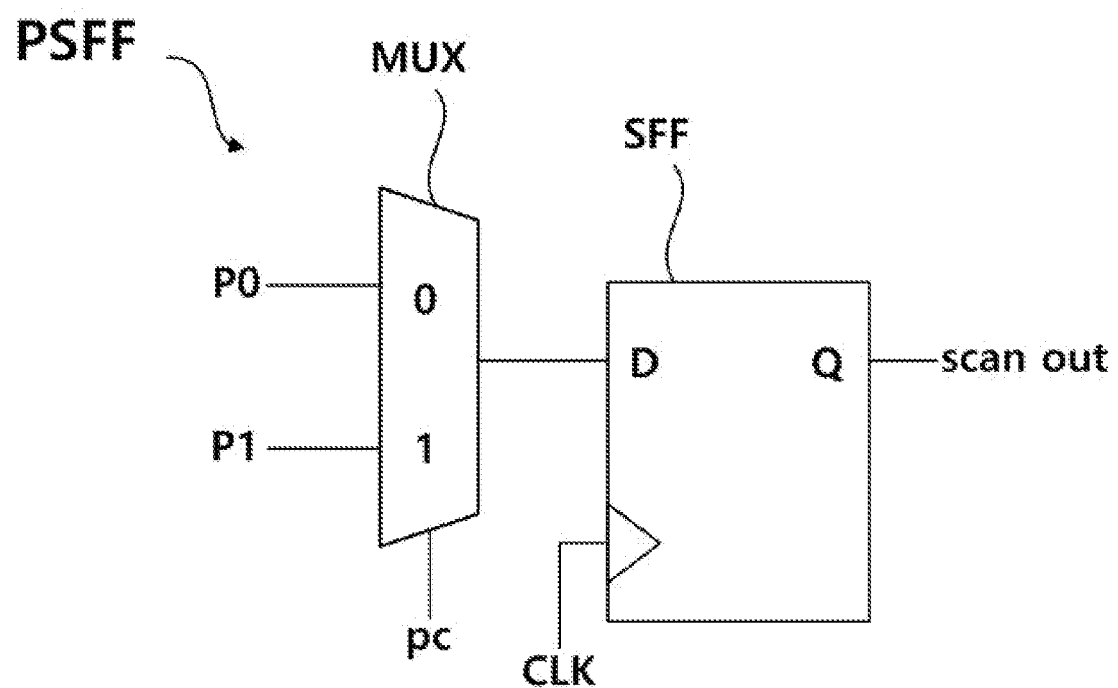
FIG. 2 is a circuit diagram showing an overview of a path control scan flipflop according to the present exemplary embodiment.

FIG. 2 is a circuit diagram showing an overview of the path control scan flipflop PSFF according to the present exemplary embodiment. Referring to FIGS. 1 and 2, in the path control scan flipflop PSFF, an output P0 of a previous stage of a scan chain connected in cascade is provided to one input, and an output P1 of another scan chain in the same column as the path control scan flipflop PSFF is provided to the other input. Also, the path control scan flipflop PSFF includes a multiplexer (MUX) to which the path control signal pc is provided and a scan flipflop SFF to which an output signal of the MUX is provided.

The scan flipflop SFF may be a D flipflop to which the output of the MUX is provided as an input. Test patterns are sequentially provided to the scan flipflop SFF through the scan chain and provide the test patterns to the DUT (not shown). Also, the scan flipflop SFF captures an output corresponding to the test patterns from the DUT (not shown) and provides the output to the outside of the scan chain. As described above, the same path control signal pc is provided to flipflops included in the same column among the path control scan flipflops PSFF disposed in an array.

Figure 3:
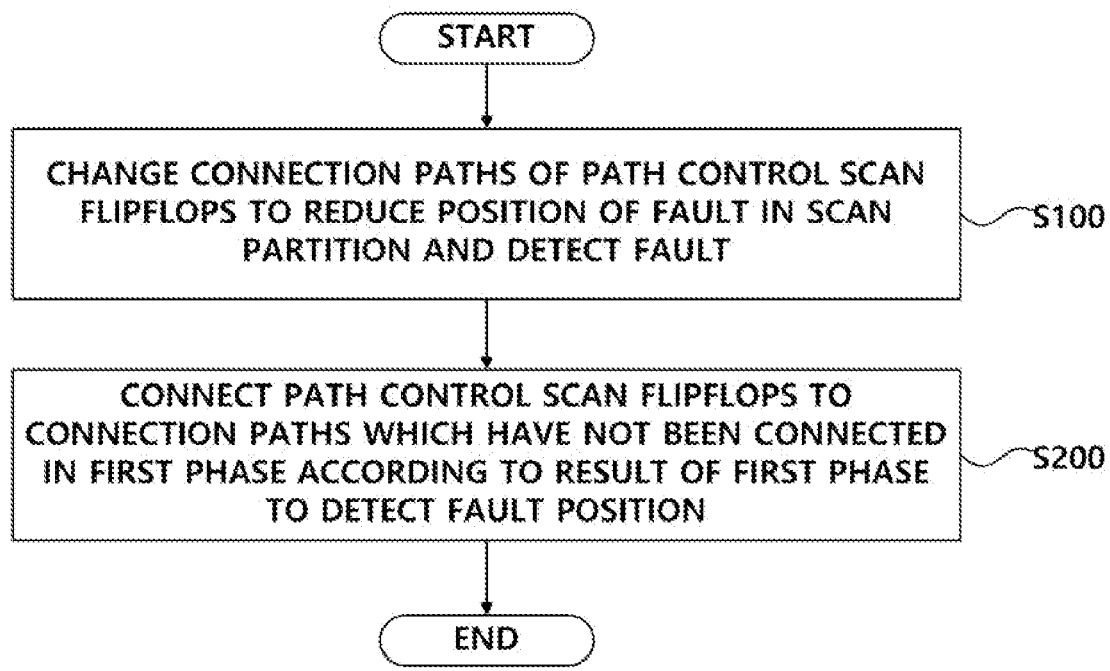
FIG. 3 is a flowchart illustrating an overview of a method of diagnosing a scan chain fault according to the present exemplary embodiment.

A method of diagnosing a scan chain fault according to the present embodiment will be described below with reference to the accompanying drawings. FIG. 3 is a flowchart illustrating an overview of a method of diagnosing a scan chain fault according to the present exemplary embodiment. Referring to FIG. 3, the method of diagnosing a scan chain fault according to the present exemplary embodiment includes a first phase S100 of controlling connection paths of the path control scan flipflops PSFF to reduce a fault range in a scan partition, which includes a plurality of scan chains including the path control scan flipflops PSFF connected to the simple scan flipflops SFF in cascade, and detect a fault and a second phase S200 in which the path control scan flipflops PSFF are connected to connection paths, which have not been changed in the first phase S100, according to a result of the first phase S100 to detect a position of the fault in the scan partition.

Figure 4:
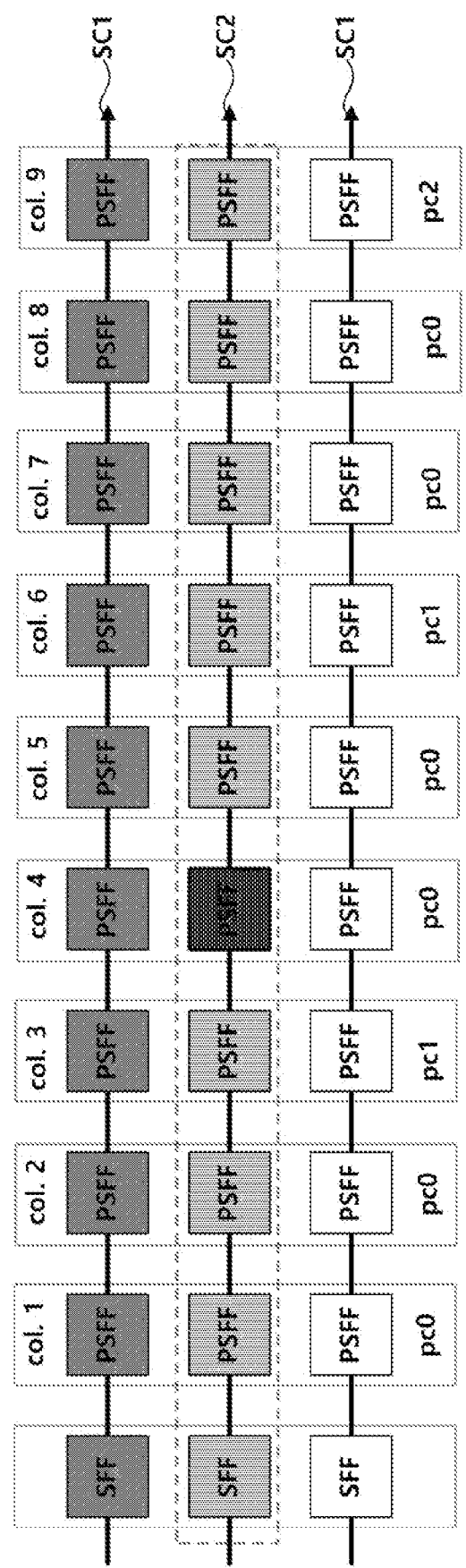

FIGS. 4 to 7 are diagrams illustrating first to fourth operations of the first phase S100. Faulty path control scan flipflops are shown in a dark color, and the position of a fault detected in each operation is shown in a broken-line quadrangle. Referring to FIG. 4, in a first operation of the first phase S100, the control unit 100 does not change connection relationships of the scan chains and performs a flush test with the connection relationships of the scan chains unchanged. The flush test is a test of shifting in a predetermined flush pattern to a scan chain and checking an output of the scan chain to determine whether the input test pattern is output. In this way, it is possible to determine whether the scan chain is faulty.

According to an exemplary embodiment, a flush pattern which is provided to the input of a scan chain to perform a flush test may include logic highs and logic lows at a predetermined ratio and/or in a predetermined sequence. For example, the flush pattern may be a bit sequence in which a binary number "0011" is repeated. Accordingly, when an output which does not have the predetermined ratio and/or the predetermined sequence is provided from the output of the scan chain, it is possible to determine whether the scan chain is faulty.

In the example of the first operation shown in FIG. 4, a fault is located in the second scan chain SC2. When the fault is a stuck-at fault, the output of the second scan chain SC2 has a fixed logic level, and when the fault is a delay fault, a pattern different from the input flush pattern is output. Accordingly, the control unit 100 may determine whether the second scan chain SC2 is faulty from the output of the second scan chain SC2. When the flush test is performed, the first scan chain SC1 and the third scan chain SC3 provide an output corresponding to the input flush pattern, but the second scan chain SC2 outputs a signal generated under the influence of the fault. Consequently, it is possible to know that the fault is located in the second scan chain SC2.

Subsequently, in the example of a second operation shown in FIG. 5, the control unit 100 changes paths in the scan partition by providing path control signals. According to an exemplary embodiment, assuming that the length of a scan chain including L scan cells is L and the number of scan chains included in the scan partition SP is N, the control unit 100 changes paths by providing a path control signal pci to an $(N^i)^{th}$ column where $N^i$ is smaller than but closest to L.

Figure 5:
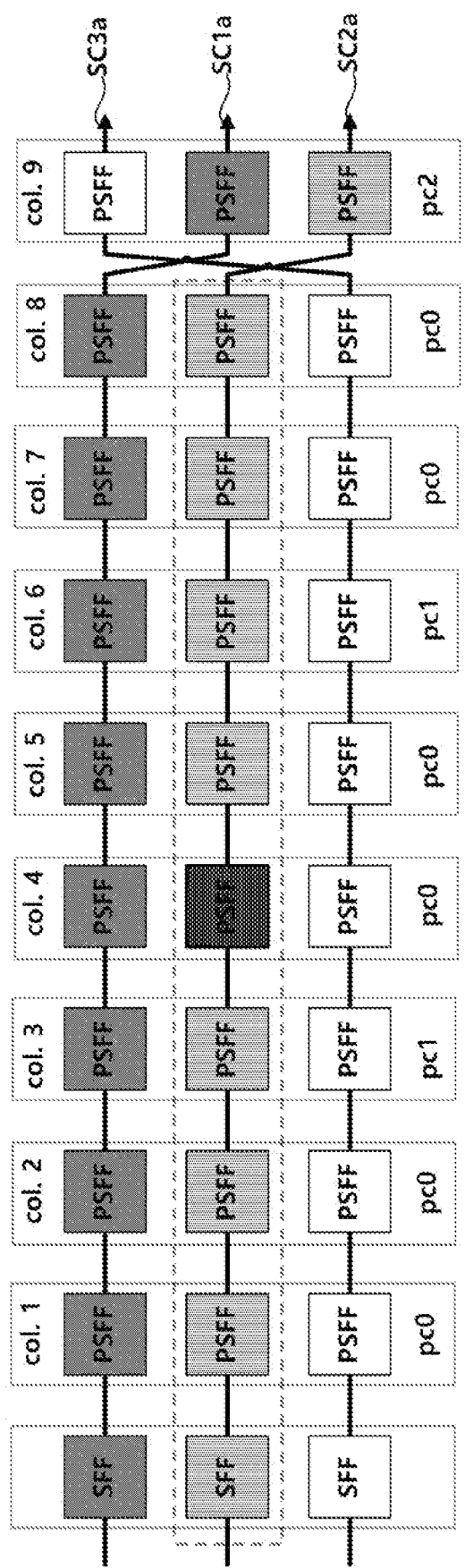

In the exemplary embodiment illustrated in FIG. 5, because $3^2=9$, i is determined to be 2. Accordingly, the control unit 100 outputs the path control signal pc2 to the $9^{th}$ ($=3^2$) column, thereby changing paths. Although the paths are changed, a second scan chain SC2a outputs a signal generated under the influence of the fault, and thus it is possible to know that the fault is located in advance of a path change point, that is, in a region indicated by a broken-line quadrangle in the second scan chain SC2a.

In the exemplary embodiment of a third operation illustrated in FIG. 6, the control unit 100 changes paths by providing a path control signal to (multiples of $N^{i-1})^{th}$ columns. However, the paths of the ninth column col. 9 which have already been changed are not changed. Accordingly, the control unit 100 outputs the path control signal pc1 to a third column col. 3 and a sixth column col. 6 which are (multiples of 3 $(=3^1))^{th}$ columns, thereby changing paths.

As results of a flush test performed after the path change, a second scan chain SC2b and a third scan chain SC3b of which the paths have been changed output signals generated without the influence of the fault, but a first scan chain SC1b outputs a signal generated under the influence of the fault. Accordingly, the control unit 100 can determine that the fault is located in scan cells (a broken-line quadrangle) that correspond in common to the second scan chain SC2a in the previous operation and a first scan chain SC1b after this path change.

Subsequently, the control unit 100 changes paths by sequentially providing a path control signal to (multiples of 1 (i.e., $N^0=1))^{th}$ columns of which the paths have not been changed. After the path change, a scan chain from which a signal generated under the influence of the fault is output is detected in the subsequent flush test results, and a common point between the detected scan chain and the scan chain of the previous operation is determined to detect the position of the fault.

In the exemplary embodiment of a fourth operation illustrated in FIG. 7, the control unit 100 changes paths by providing the path control signal pc0 to a first column col. 1, a second column col. 2, a fifth column col. 5, a seventh column col. 7, and an eighth column col. 8 which are (multiples of 1 $(=3^0))^{th}$ columns other than columns of which the paths have not been changed already.

When a flush test is performed after the path change, a second scan chain SC2c and a third scan chain SC3c output signals generated without the influence of the fault, but a first scan chain SC1c outputs a signal generated under the influence of the fault. Accordingly, it is possible to know that the fault is located in the first scan chain SC1c. Also, from the previous flush test results and the present flush test results, it is possible to know that the fault is located in a broken-line quadrangle in which the scan chain SC1b and the scan chain SC1c overlap each other.

In this way, when the first phase S100 is performed, it is possible to accurately detect all the positions of single faults located in the scan partition. When no fault is detected or one or two faults are detected in the scan partition, the control unit 100 may finish the fault detection process with the first phase S100. Like this, when fault detection is finished by detecting one or two single faults, the time and power required for the fault detection can be reduced, and thus it is possible to increase productivity.

Next, the first phase S100 and the second phase S200 of a fault detection method according to the present embodiment will be described with another example. FIGS. 8 to 11 are diagrams illustrating the first phase S100. In the shown embodiment, a scan chain length L is 8, and the number N of scan chains included in a scan partition is 2. $2^i=2^2=4$ is the maximum value smaller than 8, the length of the scan chain. Accordingly, the control unit 100 provides the path control signal pc2 to the $4^{th}$ ($=2^2$) column col. 4.

Also, the path control signal pc1 is provided to the second column col. 2 and the sixth column col. 6 that are (multiples of 2 $(=2^1))^{th}$ columns to which no path control signal has been provided. Subsequently, the path control signal pc0 is provided to the first column col. 1, the third column col. 3, the fifth column col. 5, and the seventh column col. 7 that are (multiples of 1 $(=2^0))^{th}$ columns to which no path control signal has been provided.

Figure 8:
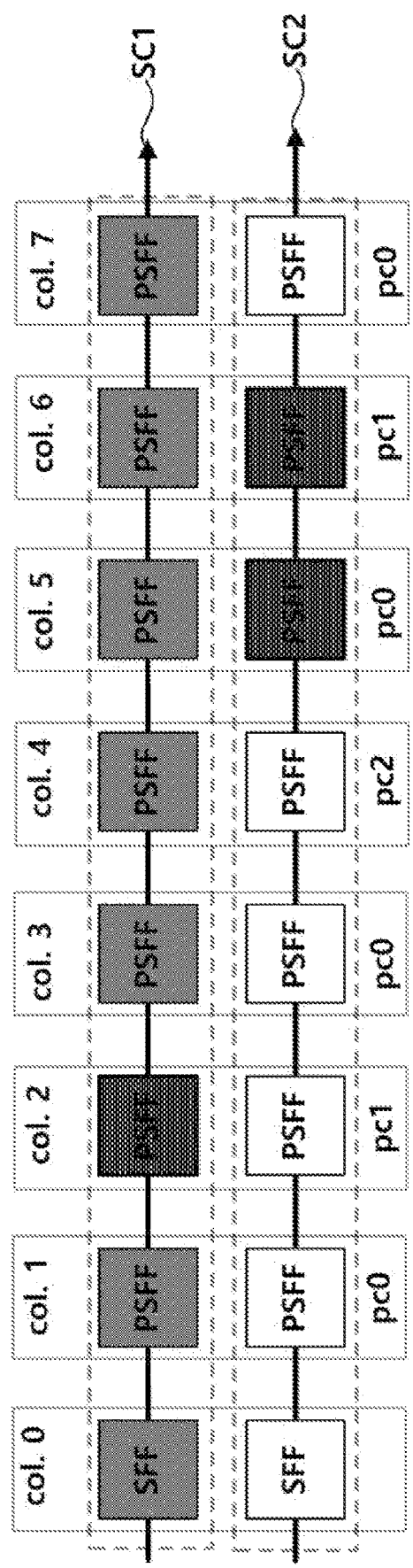
FIGS. 8 to 11 are diagrams illustrating the first phase according to another exemplary embodiment.

Referring to FIG. 8, in a first operation of the first phase S100, the control unit 100 does not change paths of the scan cells. A flush test is performed without changing the paths of the scan cells. As flush test results, the first scan chain SC1 and the second scan chain SC2 both provide outputs under the influence of faults. Accordingly, faults are determined to be located in the first scan chain SC1 and the second scan chain SC2 as indicated by broken-line quadrangles.

Figure 9:
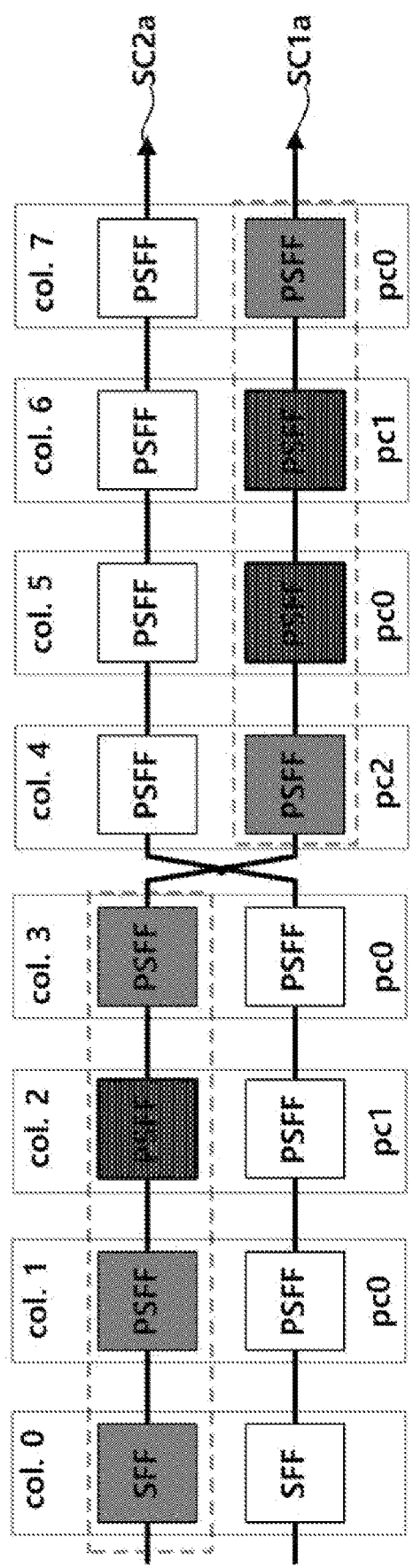

Referring to FIG. 9, since the largest value of $2^i$ smaller than 8 which is the scan chain length L is $2^2=4$, the control unit 100 changes paths by providing the path control signal pc2 to the fourth column col. 4. Results of a flush test performed after the path change indicate that a second scan chain SC2a provides an output without the influence of faults and a first scan chain SC1a provides an output under the influence of faults.

Accordingly, from the results of the flush test, a positional range of faults may be reduced to regions indicated by broken-line quadrangles.

Figure 10:
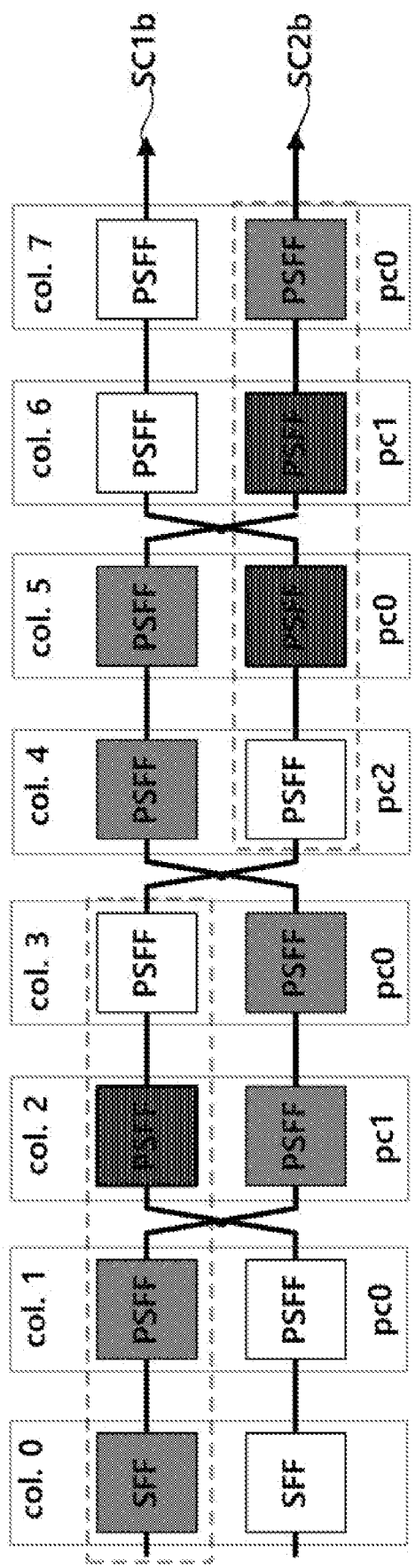

Referring to FIG. 10, the control unit 100 changes paths by providing the path control signal pc1 to the second column col. 2 and the sixth column col. 6 of which the paths have not been changed already among (multiples of 2 $(=2^1))^{th}$ columns. From results of a flush test performed after the path change, it is possible to know that a first scan chain SC1b and a second scan chain SC2b both provide outputs under the influence of faults.

Figure 11:
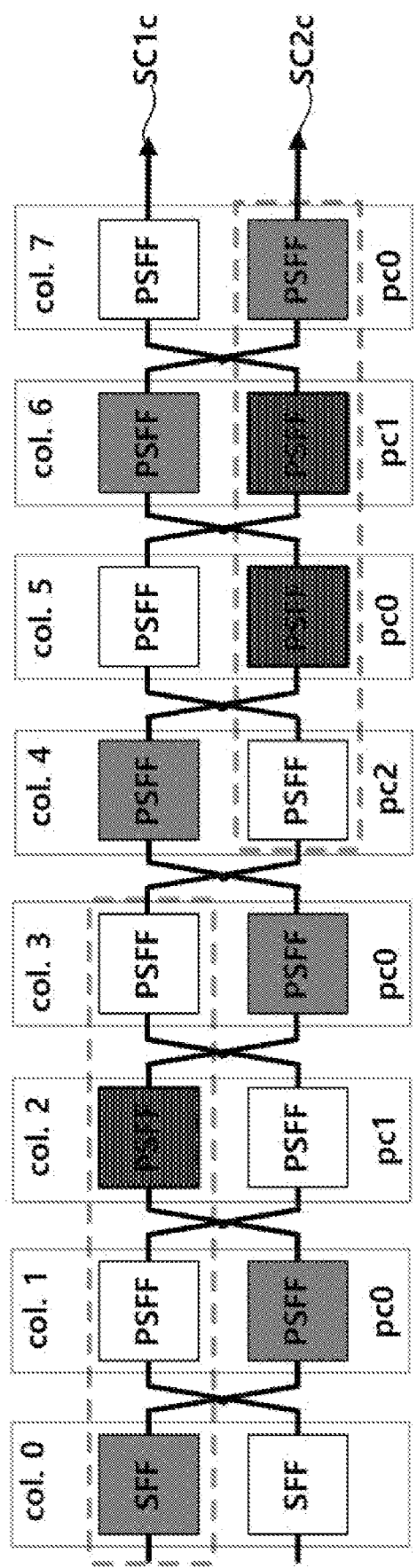

Referring to FIG. 11, the control unit 100 changes paths by providing the path control signal pc0 to the first column col. 1, the third column col. 3, the fifth column col. 5, and the seventh column col. 7 of which the paths have not been changed already among (multiples of 1 $(=2^0))^{th}$ columns. From results of a flush test performed after the path change, it is possible to know that a first scan chain SC1c and a second scan chain SC2c both provide outputs under the influence of faults. A positional range of faults may be determined to be eight scan cells by performing the first phase S100.

Next, the second phase S200 will be described with reference to FIGS. 12 to 16. In the second phase S200, the control unit 100 provides path control signals so that scan chains may be formed through paths that have not been changed and connected in the first phase S100. Paths are changed by providing 0, 0, and 1 as values of the path control signals pc0, pc1, and pc2 in the exemplary embodiment of the first phase S100 illustrated in FIG. 9, by providing 0, 1, and 1 as values of the path control signals pc0, pc1, and pc2 in the exemplary embodiment illustrated in FIG. 10, and by providing 1, 1, and 1 as values of the path control signals pc0, pc1, and pc2 in the exemplary embodiment illustrated in FIG. 11.

However, in the second phase S200, paths are formed by providing a combination of the path control signals pc0, pc1, and pc2 that is not provided in the first phase S100. As an exemplary embodiment, paths formed by providing a combination of 0, 1, and 0, 1, 0, and 1, etc. as values of the path control signals pc0, pc1, and pc2 are not formed in the first phase S100. In the second phase S200, the control unit 100 changes paths of the scan chains to paths that are not formed in the first phase S100 by providing a combination of values of the path control signals pc0, pc1, and pc2 that are not provided in the first phase S100.

For example, the control unit 100 may remove combinations of values of the path control signals pc0, pc1, and pc2 that are provided in the first phase S100 from among 000 to 111 and then change paths by outputting the path control signals pc0, pc1, and pc2 having values of a remaining combination.

Figure 12:
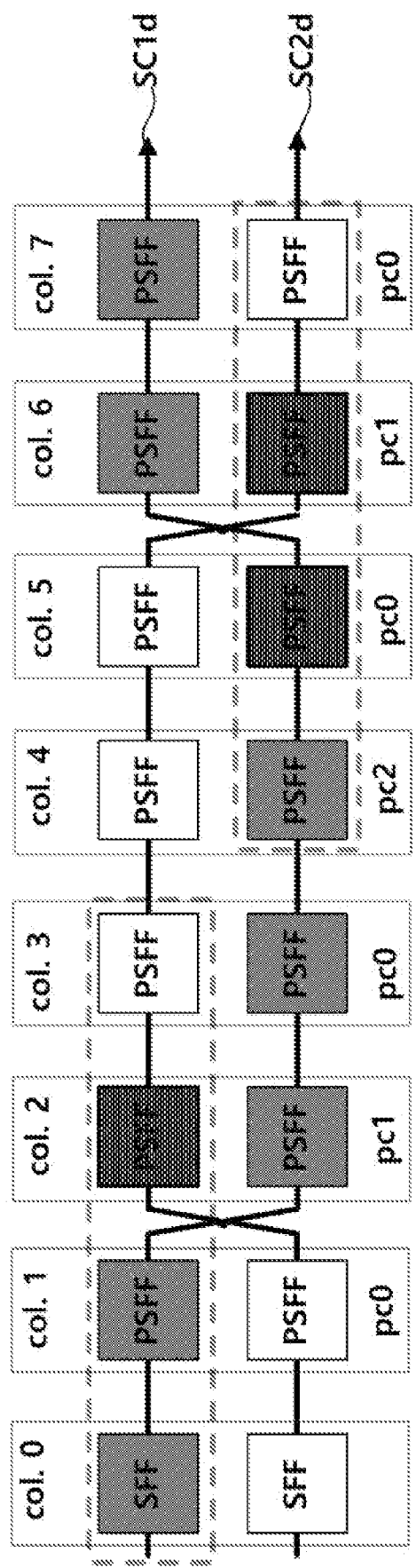
FIG. 12 is a diagram illustrating a connection relationship in any one operation of a second phase.

FIG. 12 is a diagram illustrating a connection relationship in any one operation of the second phase S200. Referring to FIG. 12, in the present operation, the control unit 100 changes paths by providing 0, 1, and 0 as values of the path control signals pc0, pc1, and pc2. After the path change, a first scan chain SC1d and a second scan chain SC2d are involved in faults and thus both output signals generated under the influence of the faults.

Figure 13:
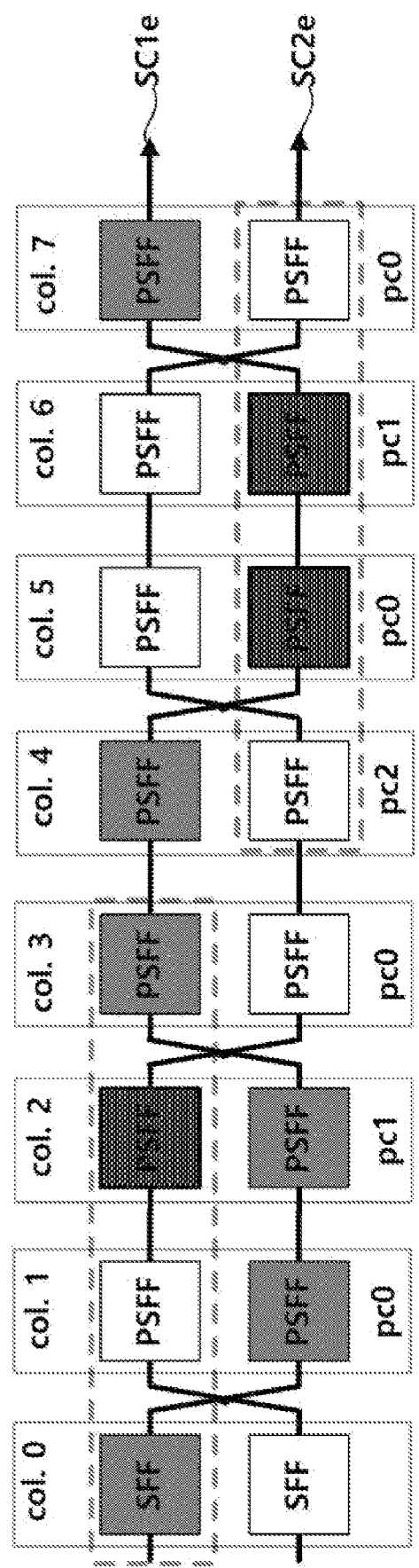
FIG. 13 is a diagram illustrating a connection relationship in another operation of the second phase.

FIG. 13 is a diagram illustrating a connection relationship in another operation of the second phase 200. Referring to FIG. 12, in the present operation, the control unit 100 changes paths by providing 1, 0, and 0 as values of the path control signals pc0, pc1, and pc2. After the path change, a first scan chain SC1e and a second scan chain SC2e are involved in faults and thus both output signals generated under the influence of the faults.

Figure 14:
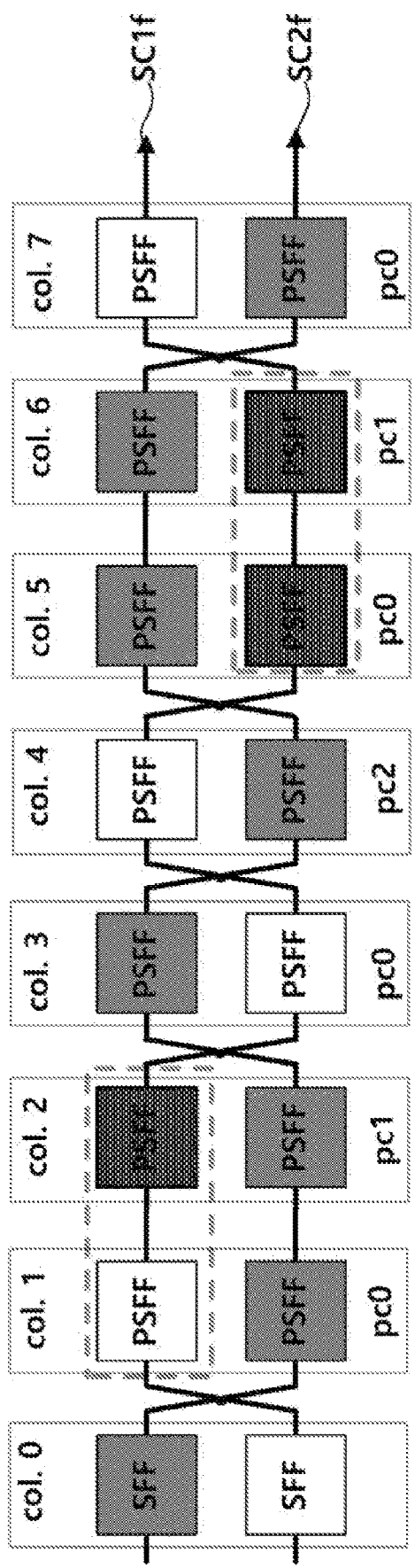
FIG. 14 is a diagram illustrating a connection relationship in still another operation of the second phase.

FIG. 14 is a diagram illustrating a connection relationship in still another operation of the second phase 200. Referring to FIG. 13, in the present operation, the control unit 100 changes paths by providing 1, 0, and 1 as values of the path control signals pc0, pc1, and pc2. After the path change, a second scan chain SC2f is not involved in faults and thus outputs a signal generated without the influence of the faults. On the other hand, a first scan chain SC1f is involved in faults and thus outputs a signal generated under the influence of the faults. Accordingly, when a positional range of faults is determined by overlapping a positional range of faults determined in the previous phase and/or the previous operation and a positional range of faults detected in the present operation, a positional range of faults may be reduced to a region indicated by broken-line quadrangles.

Figure 15:
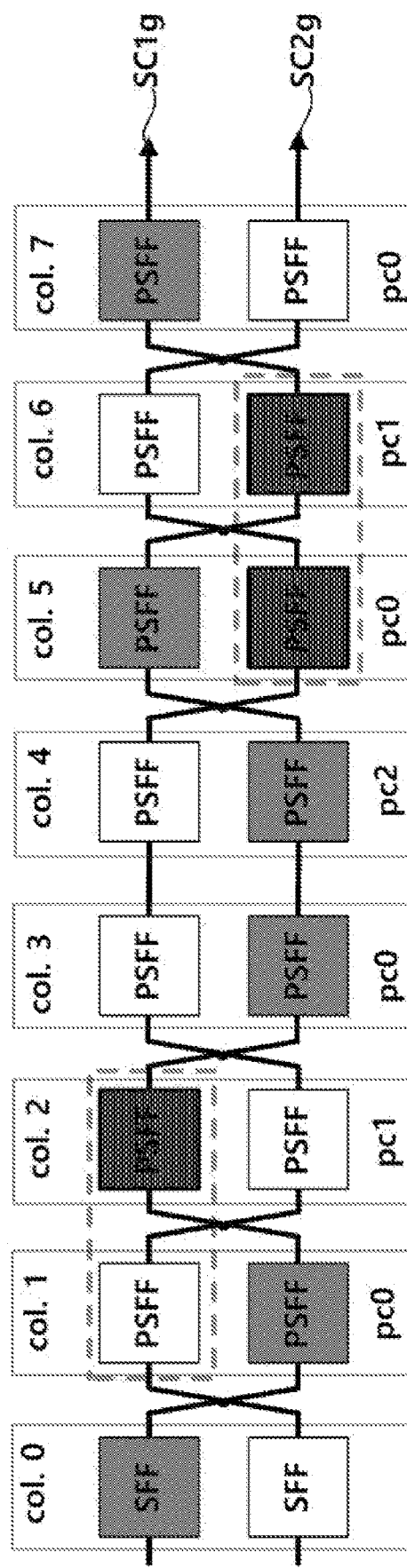
FIG. 15 is a diagram illustrating a connection relationship in yet another operation of the second phase.

FIG. 15 is a diagram illustrating a connection relationship in yet another operation of the second phase S200. Referring to FIG. 15, in the present operation, the control unit 100 changes paths by providing 1, 1, and 0 as values of the path control signals pc0, pc1, and pc2. After the path change, a first scan chain SC1g and a second scan chain SC2g are both involved in faults and thus both output signals generated under the influence of the faults.

When the first phase S100 is performed on multiple faults, a positional range of three faults can be reduced to eight scan cells. Subsequently, when the second phase S200 is performed, the positional range of the faults can additionally be reduced to four scan cells. Consequently, according to the present exemplary embodiment, it is possible to detect multiple faults at a high resolution.

Figure 16:
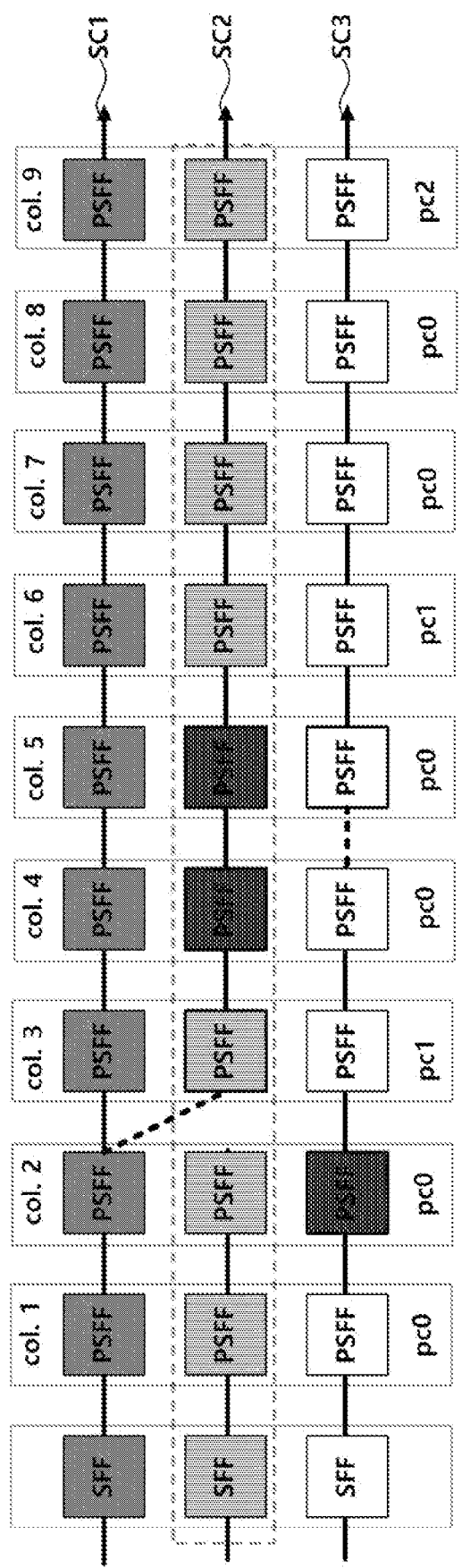
FIGS. 16 and 17 are diagrams illustrating a method of detecting whether a multiplexer is faulty.

However, the path control scan flipflops PSFF according to the present exemplary embodiment include a scan flipflop and a MUX, and a fault may occur at the MUX which changes a path. A method of detecting whether a MUX is faulty will be described below with reference to FIGS. 16 and 17. FIG. 16 is a diagram illustrating an initial operation of the first phase S100. FIG. 16 illustrates a case in which paths are not changed even when path control signals are provided because a stuck-at fault occurs at scan flipflops located in a fourth column col. 4 and a fifth column col. 5 of a second scan chain SC2 and a scan flipflop located in a second column col. 2 of a third scan chain SC3 and a fault occurs at a MUX of a path control scan flipflop in a third column col. 3 of the second scan chain SC2 and a MUX of a path control scan flipflop in the fifth column col. 5 of the third scan chain SC3.

According to an exemplary embodiment, in the first operation of the first phase S100, a flush test is performed without changing paths of the scan chains. For example, the flush test is performed by inputting flush patterns of 0011, 1001, and 1100 to a first scan chain SC1, the second scan chain SC2, and the third scan chain SC3, respectively.

The first scan chain SC1 which is not involved in faults outputs 0011. On the other hand, the second scan chain SC2 is connected to the first scan chain SC1 due to the fault of the MUX and outputs 1111 or 0000 due to the stuck-at faults of the scan flipflops. Also, the third scan chain SC3 outputs 1110 or 0000 due to the stuck-at fault of the scan flipflop. From this, whether a stuck-at fault has occurred at scan flipflops may be determined, but the faults of the MUXs are not detected.

Figure 17:
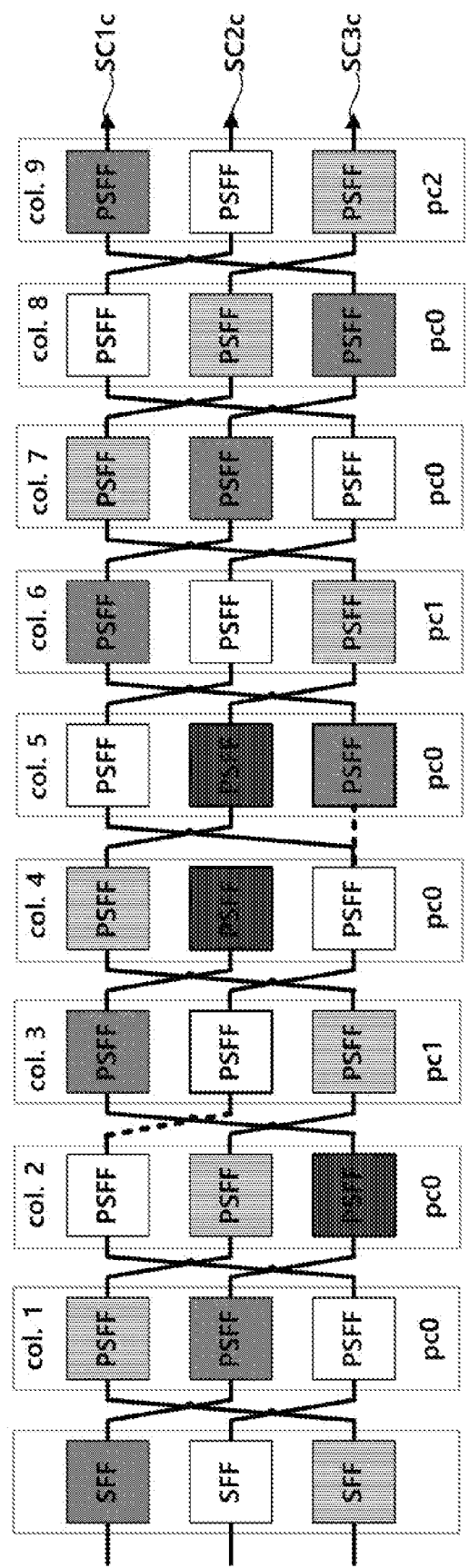

FIG. 17 is a diagram schematically illustrating a last operation of the above-described first phase S100 according to the present exemplary embodiment. Referring to FIG. 17, the control unit 100 provides path control signals such that paths are changed. A flush test is performed by inputting flush patterns of 0011, 1001, and 1100 to a first scan chain SC1c, a second scan chain SC2c, and a third scan chain SC3c, respectively.

The third scan chain SC3c outputs a pattern of 1111 or 0000 due to the stuck-at fault of the scan flipflop, and the second scan chain SC2c outputs the input flush pattern of 1001 because there is no fault. On other hand, a fault occurs at the MUX of the path control scan flipflop located in the fifth column col. 5 of the first scan chain SC1c, and thus the first scan chain SC1c is connected to the third scan chain SC3c. Accordingly, the first scan chain SC1c outputs 1100 which is the flush pattern input to the third scan chain SC3c.

In other words, a flush test is performed by inputting a flush pattern to a scan chain, and then a fault of a MUX can be detected by detecting a shifted phase of a signal output from the flush test through the input flush pattern.

To aid in understanding the present invention, the present invention has been described with reference to the exemplary embodiments shown in the accompanying drawings. However, the embodiments are intended for implementation and only exemplary. Those of ordinary skill in the art should appreciate that various modifications and other equivalent embodiments can be made from the embodiments. Therefore, the technical scope of the present invention should be determined by the following claims.

What is claimed is:

1. A scan device comprising a scan partition including a plurality of scan chains which include path control scan flipflops connected to scan flipflops in cascade,
   wherein connection paths of the scan flipflops in the scan partition are controllable, and
   the connection paths of the path control scan flipflops are controlled to detect a position of a fault such that a fault range in the scan partition is reduced to diagnose the fault.

2. The scan device of claim 1, wherein the path control scan flipflops are disposed in an array in the scan partition, and
   the connection paths of the path control scan flipflops disposed in the same column in the array are controlled with the same path control signal.

3. The scan device of claim 1, wherein each of the path control scan flipflops comprises:
   a first input to which an output of a previous stage is provided in the scan chain in which the path control scan flipflop is disposed;
   a second input to which an output of the same column as the path control scan flipflop in another scan chain included in the scan partition is provided;
   a multiplexer (MUX) configured to output any one of signals provided to the first input and the second input according to a path control signal; and
   a flipflop.

4. The scan device of claim 1, wherein the scan device diagnosing the fault:
   performs a first phase of controlling the connection paths of the path control scan flipflops to reduce the fault range in the scan partition and detect the position of the fault; and
   further performs a second phase when three or more faults are detected in the scan partition as a result of the first phase.

5. The scan device of claim 4, wherein each of the scan chains includes L of the scan flipflops,
   the scan partition includes the N scan chains, and
   the first phase comprises:
   (a) performing a flush test without changing the paths;
   (b) providing a path control signal to an $(N^i)^{th}$ column, where $N^i$ is smaller than but closest to L, to change the paths and performing a flush test; and
   (c) sequentially providing the path control signal to (multiples of $N^{i-1})^{th}$ columns and (multiples of $N^{i-2})^{th}$ columns to a first column, of which the paths have not been changed, to change the paths and performing a flush test (N, L, and i: integers greater than or equal to 0).

6. The scan device of claim 5, wherein the paths formed in the second phase are paths which are not connected in operations (a) to (c).

7. The scan device of claim 4, wherein, when no fault is detected or two or fewer faults are detected in the scan partition as a result of the first phase, the scan device stops detecting the position of the fault.

8. The scan device of claim 5, wherein the position of the fault is detected through the flush test, which provides a flush pattern including logic highs and logic lows at a predetermined ratio, and
   when an input signal including the logic highs and the logic lows at the predetermined ratio is output with a changed phase, the path control scan flipflop is determined to be faulty.

9. A method of diagnosing a scan chain fault, the method comprising:
   a first phase of changing connection paths of path control scan flipflops to reduce a fault range in a scan partition, which includes a plurality of scan chains including the path control scan flipflops connected to simple scan flipflops in cascade, and detect a fault; and
   a second phase in which the path control scan flipflops are connected to connection paths, which have not been changed in the first phase, according to a result of the first phase to detect a position of the fault in the scan partition.

10. The method of claim 9, wherein the path control scan flipflops are disposed in an array in the scan partition, and
    the connection paths of the path control scan flipflops disposed in the same column in the array are controlled with the same path control signal.

11. The method of claim 9, wherein each of the path control scan flipflops comprises:
    a first input to which an output of a previous stage is provided in the scan chain in which the path control scan flipflop is disposed;
    a second input to which an output of the same column as the path control scan flipflop in another scan chain included in the scan partition is provided;
    a multiplexer (MUX) configured to output any one of signals provided to the first input and the second input according to a path control signal; and
    a flipflop.

12. The method of claim 9, wherein the second phase is performed when three or more faults are detected in the scan partition as a result of the first phase.

13. The method of claim 9, wherein each of the scan chains includes L of the scan flipflops, the scan partition includes the N scan chains, and the first phase comprises:

(a) performing a flush test without changing the paths;

(b) providing a path control signal to an $(N^i)^{th}$ column, where $N^i$ is smaller than but closest to L, to change the paths and performing a flush test; and (c) sequentially providing the path control signal to (multiples of $N^{i-1})^{th}$ columns and (multiples of $N^{i-2})^{th}$ columns to a first column, of which the paths have not been changed, to change the paths and performing a flush test (N, L, and i: integers greater than or equal to 0).

14. The method of claim 13, wherein the second phase comprises providing the path control signal to the $(N^i)^{th}$ column and $N^{i-1}$th column to the first column in order of not receiving the path control signal in operations (a) to (c) to detect the fault.

15. The method of claim 9, wherein, when no fault is detected or two or fewer faults are detected in the scan partition as a result of the first phase, the detection of the position of the fault is stopped.

16. The method of claim 13, wherein the position of the fault is detected through the flush test, which provides a flush pattern including logic highs and logic lows at a predetermined ratio, and when an input signal having the logic highs and the logic lows at the predetermined ratio is output with a different phase than the input flush pattern, the path control scan flipflop is determined to be faulty.

* * * * *